(12) United States Patent
Halbritter et al.

(10) Patent No.: US 10,797,469 B2
(45) Date of Patent: Oct. 6, 2020

(54) SEMICONDUCTOR LASER AND METHOD FOR PRODUCING SUCH A SEMICONDUCTOR LASER

(71) Applicant: OSRAM OLED GmbH, Regensburg (DE)

(72) Inventors: Hubert Halbritter, Dietfurt (DE); Andreas Plößl, Regensburg (DE); Roland Heinrich Enzmann, George Town (MY); Martin Rudolf Behringer, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/343,989

(22) PCT Filed: Jan. 9, 2018

(86) PCT No.: PCT/EP2018/050459
§ 371 (c)(1),
(2) Date: Apr. 22, 2019

(87) PCT Pub. No.: WO2018/134086
PCT Pub. Date: Jul. 26, 2018

(65) Prior Publication Data
US 2019/0245326 A1    Aug. 8, 2019

(30) Foreign Application Priority Data
Jan. 19, 2017   (DE) ........................ 10 2017 100 997

(51) Int. Cl.
*H01S 5/00*    (2006.01)
*H01S 5/183*   (2006.01)
(Continued)

(52) U.S. Cl.
CPC ........ *H01S 5/18386* (2013.01); *H01S 5/0224* (2013.01); *H01S 5/04256* (2019.08);
(Continued)

(58) Field of Classification Search
CPC ............. H01S 5/18377; H01S 5/04256; H01S 5/0224; H01S 5/18305; H01S 5/18313;
(Continued)

(56) References Cited

U.S. PATENT DOCUMENTS 6,888,871 B1    5/2005  Zhang et al.
7,057,999 B2    6/2006  Cheong et al.
(Continued)

FOREIGN PATENT DOCUMENTS

CN    1448000 A    10/2003
CN    1463480 A    12/2003
(Continued)

OTHER PUBLICATIONS

Holl, S.L. et al., "Fabrication Techniques for Thin-Film Silicon Layer Transfer," ECS Transactions—The Electrochemical Society, vol. 3, Issue 6, 2006, 7 pages.

*Primary Examiner* — Kinam Park
(74) *Attorney, Agent, or Firm* — Slater Matsil, LLP

(57) ABSTRACT

A semiconductor laser and a method for producing such a semiconductor laser are disclosed. In an embodiment a semiconductor laser has at least one surface-emitting semiconductor laser chip including a semiconductor layer sequence having at least one active zone configured to generate laser radiation and a light exit surface oriented perpendicular to a growth direction of the semiconductor layer sequence. The laser further includes a diffractive optical element configured to expand and distribute the laser radiation, wherein an optically active structure of the diffractive optical element is made of a material having a
(Continued)

refractive index of at least 1.65 regarding a wavelength of maximum intensity of the laser radiation; and a connector engaging at least in places into the optically active structure and completely filling the optically active structure at least in places.

18 Claims, 10 Drawing Sheets

(51) Int. Cl.
  *H01S 5/022* (2006.01)
  *H01S 5/42* (2006.01)
  *H01S 5/042* (2006.01)
  *H01S 5/187* (2006.01)

(52) U.S. Cl.
  CPC ...... *H01S 5/18305* (2013.01); *H01S 5/18313* (2013.01); *H01S 5/18377* (2013.01); *H01S 5/18388* (2013.01); *H01S 5/423* (2013.01); *H01S 5/02276* (2013.01); *H01S 5/187* (2013.01); *H01S 5/18341* (2013.01); *H01S 2301/18* (2013.01)

(58) Field of Classification Search
  CPC .. H01S 5/18388; H01S 5/423; H01S 5/02276; H01S 5/18341; H01S 5/18386; H01S 5/187; H01S 2301/18
  See application file for complete search history.

(56) References Cited

U.S. PATENT DOCUMENTS

| | | | |
|---|---|---|---|
| 7,220,952 B2 | 5/2007 | Kaneko | |
| 7,223,619 B2 | 5/2007 | Wang et al. | |
| 7,265,439 B1 | 9/2007 | Wu et al. | |
| 7,289,547 B2 | 10/2007 | Trezza et al. | |
| 7,457,490 B2 | 11/2008 | Rudmann et al. | |
| 8,320,032 B2 | 11/2012 | Levola | |
| 8,582,618 B2 | 11/2013 | Roggero et al. | |
| 9,559,494 B2 | 1/2017 | Lauer et al. | |
| 2003/0081638 A1* | 5/2003 | Hamster | G02B 6/4204 372/23 |
| 2005/0063071 A1 | 3/2005 | Wang et al. | |
| 2005/0067681 A1 | 3/2005 | De Villeneuve et al. | |
| 2005/0195882 A1 | 9/2005 | Wang et al. | |
| 2006/0285566 A1 | 12/2006 | Ueki | |
| 2008/0232418 A1 | 9/2008 | Anan | |
| 2011/0165707 A1 | 7/2011 | Lott et al. | |
| 2013/0278151 A1* | 10/2013 | Lear | H05B 45/14 315/164 |
| 2015/0311673 A1 | 10/2015 | Wang et al. | |
| 2016/0156154 A1 | 6/2016 | Fuchida et al. | |
| 2016/0164261 A1 | 6/2016 | Warren | |
| 2018/0239096 A1* | 8/2018 | Houbertz | G02B 6/4214 |

FOREIGN PATENT DOCUMENTS

| | | |
|---|---|---|
| CN | 1722553 A | 1/2006 |
| CN | 1957507 A | 5/2007 |
| CN | 101688977 A | 3/2010 |
| CN | 102610997 A | 7/2012 |
| CN | 102709808 A | 10/2012 |
| CN | 104319625 A | 1/2015 |
| CN | 204269928 U | 4/2015 |
| CN | 105874662 A | 8/2016 |
| DE | 10058949 A1 | 7/2001 |
| DE | 102004063569 A1 | 9/2005 |
| DE | 602004013234 T2 | 5/2009 |
| DE | 102016116747 A1 | 3/2018 |
| JP | 2000070707 A | 3/2000 |
| JP | 2001266390 A | 9/2001 |
| JP | 2002368334 A | 12/2002 |
| JP | 2006351798 A | 12/2006 |
| JP | 2007049017 A | 2/2007 |
| JP | 2014096419 A | 5/2014 |
| TW | 200532761 A | 10/2005 |
| TW | I258198 B | 7/2006 |
| WO | 03003424 A1 | 1/2003 |
| WO | 2006022162 A1 | 3/2006 |

\* cited by examiner

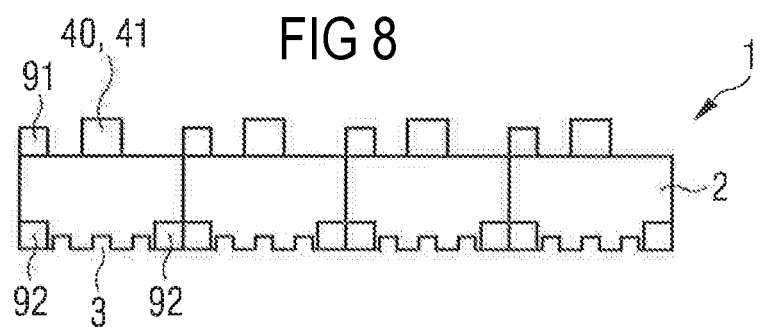
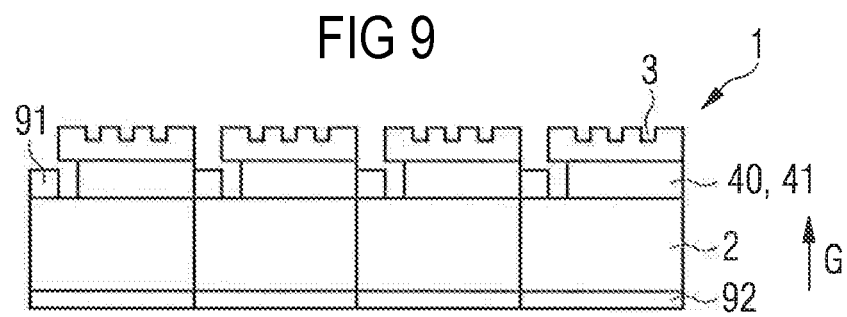
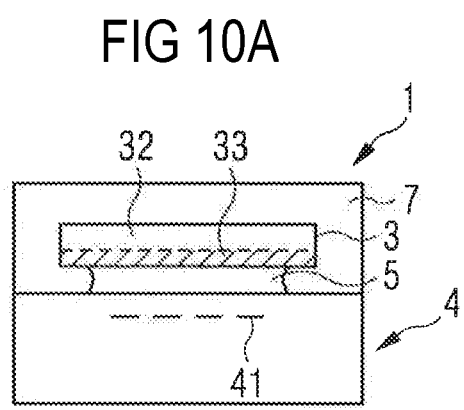
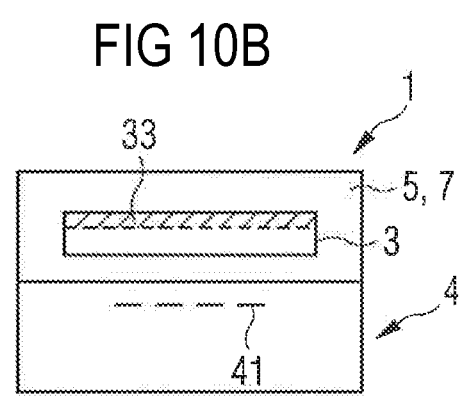
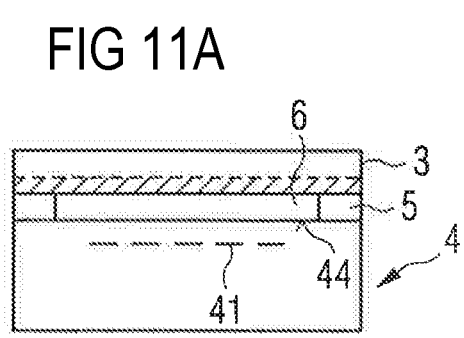
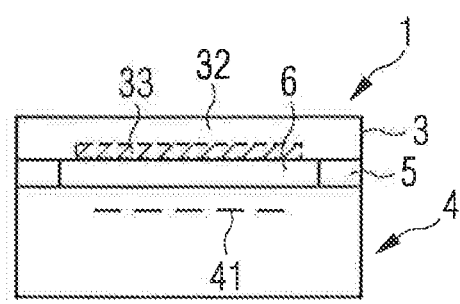

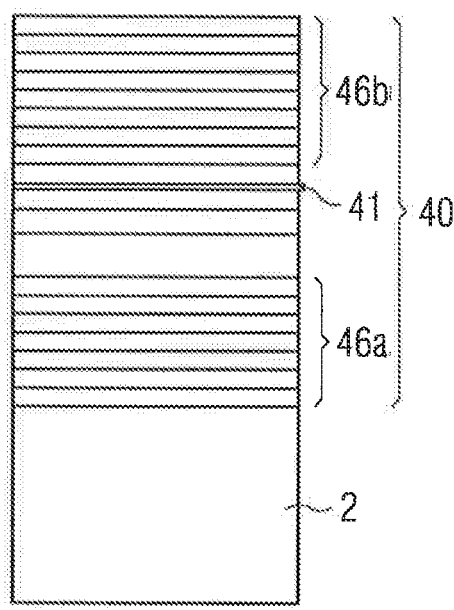
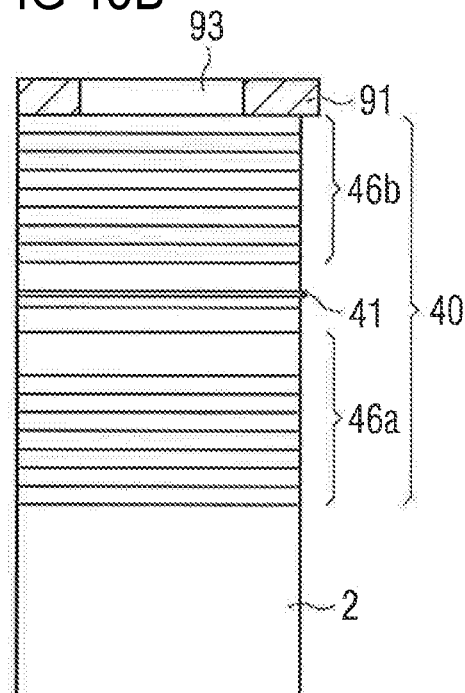
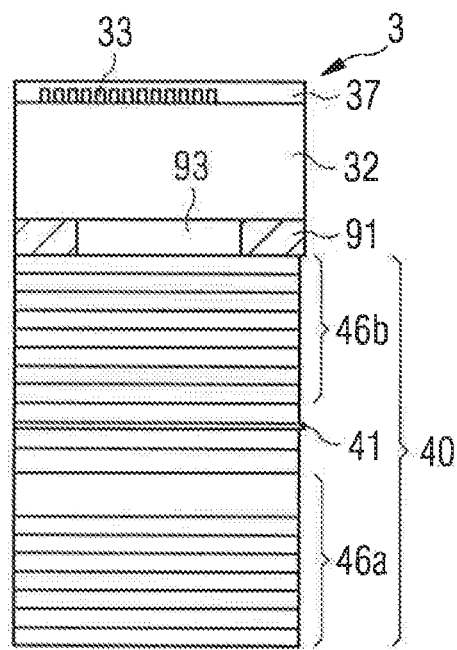
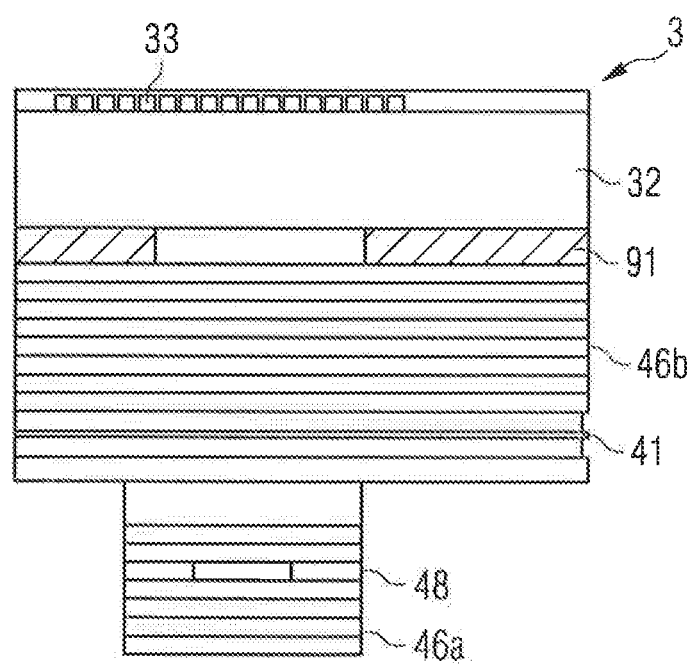

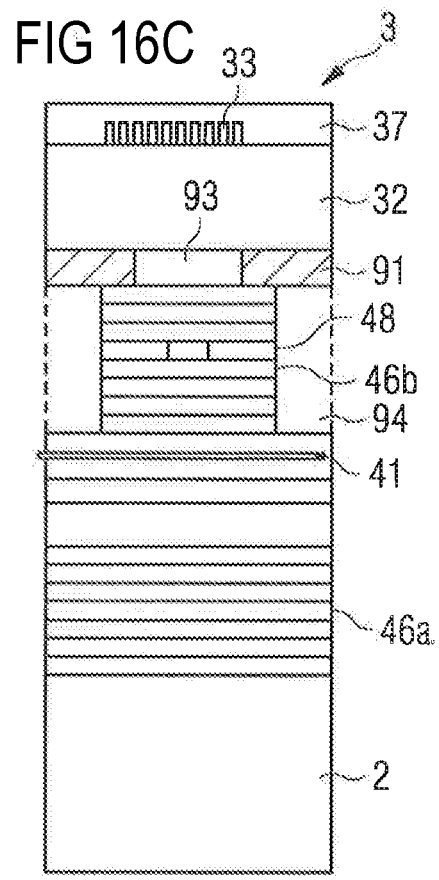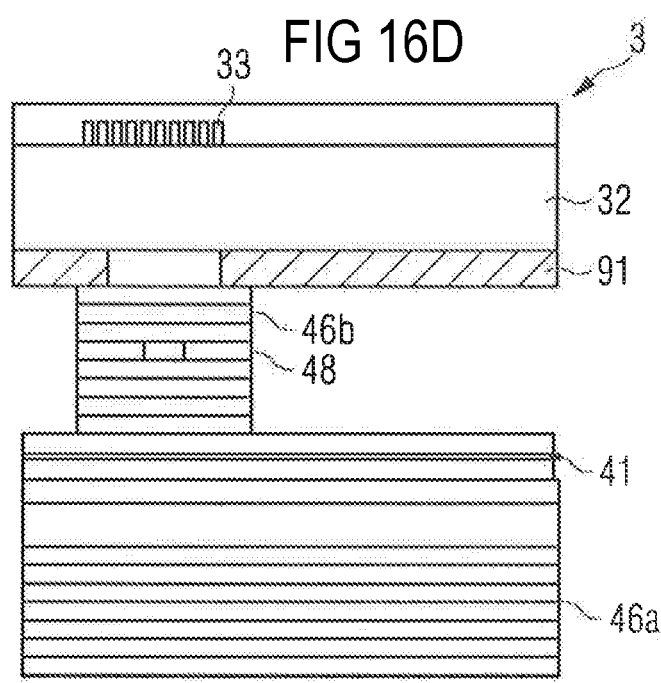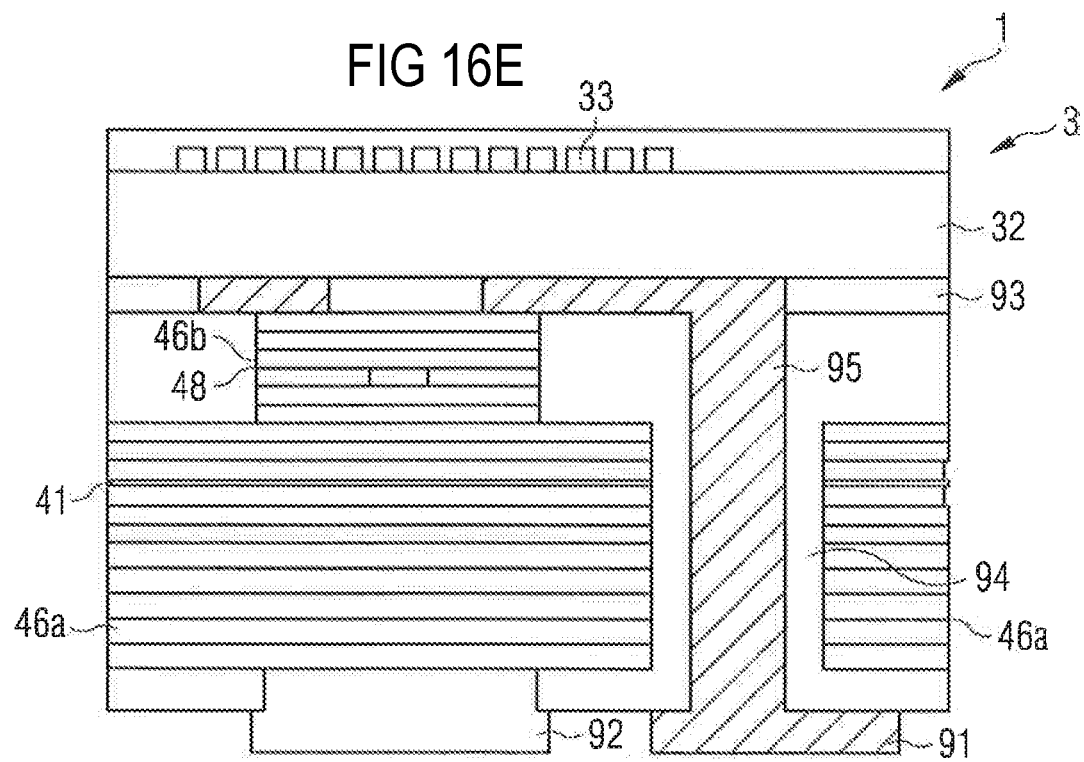

SEMICONDUCTOR LASER AND METHOD FOR PRODUCING SUCH A SEMICONDUCTOR LASER

This patent application is a national phase filing under section 371 of PCT/EP2018/050459, filed Jan. 9, 2018, which claims the priority of German patent application 102017100997.3, filed Jan. 19, 2017, each of which is incorporated herein by reference in its entirety.

TECHNICAL FIELD

A semiconductor laser and a method for producing such a semiconductor laser are provided.

SUMMARY OF THE INVENTION

Embodiments provide a semiconductor laser which can be produced in an eye-safe and efficient manner.

According to at least one embodiment, the semiconductor laser comprises one or more semiconductor laser chips. The at least one semiconductor laser chip comprises a semiconductor layer sequence. The semiconductor layer sequence comprises one or more active zones for generating laser radiation. In addition, the semiconductor laser chip has a light exit surface. The laser radiation is emitted at the light exit surface.

According to at least one embodiment, the at least one semiconductor laser chip is a surface emitter. This means, in particular, that the semiconductor laser chip emits the laser radiation generated during operation on a comparatively large surface. Said surface, that is, the light exit surface at which the semiconductor laser chip emits the laser radiation, is preferably oriented perpendicular or approximately perpendicular to a growth direction of the semiconductor layer sequence, so that a resonator direction runs parallel or approximately parallel to the growth direction. Here and in the following, 'approximately' means, in particular, with a tolerance of at most 15° or 50 or 2°. In contrast to surface emitters, on the other hand, edge emitters have an emission direction and a resonator direction in the direction perpendicular to the growth direction.

The semiconductor layer sequence is preferably based on a 13-15 compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or such as $Al_nGa_mIn_{1-n-m}As_kP_{1-k}$, wherein in each case $0 \leq n \leq 1$, $0 \leq m \leq 1$ and $n+m \leq 1$ and $0 \leq k < 1$. Preferably, the following applies to at least one layer or for all layers of the semiconductor layer sequence: $0 < n \leq 0.8$, $0.4 \leq m < 1$ as well as $n+m \leq 0.95$ and $0 < k \leq 0.5$. The semiconductor layer sequence can have dopants and additional components. For the sake of simplicity, however, only the essential components of the crystal lattice of the semiconductor layer sequence are mentioned, that is, Al, As, Ga, In, N or P, even if these can be partially replaced and/or supplemented by small quantities of further substances.

According to at least one embodiment, the semiconductor laser comprises at least one diffractive optical element, DOE for short. The diffractive optical element or elements is/are arranged for expanding and for distributing the laser radiation, in particular for distributing the laser radiation over a larger solid angle range. By means of the diffractive optical element is can be achieved that, due to the associated divergence of the laser radiation, the semiconductor laser is not particularly dangerous to the human eye, so that the semiconductor laser is eye-safe without further measures and satisfies the legal regulations required for this purpose.

Alternatively to a diffractive optical element, a beam-expanding optical element can also be present in general. The beam-expanding optical element is, for example, a microlens array or MLA for short. The microlens array has a plurality of individual lenses which are preferably arranged in a dense manner. The generated laser radiation passes through a region of the light exit surface which is preferably covered by at least to or 30 or 100 of the microlenses. Alternatively or additionally, the beam-expanding optical element can have or can consist of a scattering layer, also referred to as a diffuser. A scattering layer comprises in particular a roughening on which the laser radiation is scattered, and/or scattering particles in a matrix material that is permeable to the laser radiation. The following explanations for the diffractive optical element apply equally to the beam-expanding optical element.

According to at least one embodiment, an optically effective structure of the diffractive optical element is formed from a material having a high refractive index. In particular, the refractive index of this material is at least 1.65 or 1.75 or 1.8 or 2.0 or 2.2. The stated values for the refractive index preferably apply at an operating temperature of the semiconductor laser and at a wavelength of maximum intensity of the laser radiation generated during operation. The refractive index is furthermore preferably above that of epoxides. High-index epoxides reach approximately a value of up to 1.6.

The optically effective structure is in particular a grid-like structure which acts similarly to a diffraction grating and/or a hologram for the laser radiation. By means of the optically effective structure, the laser radiation is expanded and distributed wherein the widening and distribution preferably significantly or exclusively is based on light diffraction.

The optically active structure is produced, for example, from a 13-15 compound semiconductor material. 12-16 semiconductors such as ZnO, ZnS or ZnTe or $Ga_2O_3$, $In_2O_3$ can also be used. Furthermore, instead of single-crystal semiconductor layers, produced by metal-organic vapor-phase deposition, other semiconductor layers can also be used. In particular, amorphous layers of metal oxides having a high refractive index such as ZnO, $SnO_2$ or $Ta_2O_5$ can be used for the optically active structure.

Further examples of materials for the optically effective structure are $Al_2O_3$, especially as sapphire crystal, GaAs or GaN, in particular if the optically effective structure is etched into the growth substrate of the laser or of the semiconductor layer sequence. If the optically effective structure is to be produced from a layer deposited on the laser disk, layers of dielectrics such as aluminum oxide or silicon nitride, in each case not necessarily exactly stoichiometrically combined and/or mostly amorphous, can also be practicable.

In at least one embodiment, the semiconductor laser comprises at least one surface-emitting semiconductor laser chip, which comprises a semiconductor layer sequence having at least one active zone for generating laser radiation and a light exit surface, which is oriented perpendicular to a growth direction of the semiconductor layer sequence. The semiconductor laser further comprises a diffractive optical element, which is configured to expand and distribute the laser radiation such that the semiconductor laser is preferably eye-proof. An optically effective structure of the diffractive optical element is made of a material having a refractive index of at least 1.65 or 2.0, with respect to a wavelength of maximum intensity of the laser radiation.

In at least one embodiment, the semiconductor laser comprises at least one surface-emitting semiconductor laser chip, which comprises a semiconductor layer sequence having at least one active zone for generating laser radiation and a light exit surface, which is oriented perpendicular to a growth direction of the semiconductor layer sequence. The semiconductor laser further comprises a beam-expanding optical element, which is configured to expand and distribute the laser radiation such that the semiconductor laser is eye-safe. An optically effective structure of the beam-expanding optical element can be made of a material having a high refractive index. The semiconductor layer sequence preferably comprises at least one Bragg mirror which is penetrated by at least one electrical through-connection. An electrical contact can be arranged around the light exit surface. Said contact is preferably located between the beam-expanding optical element and the associated Bragg mirror, which is passed through by the through-connection for connecting said contact.

For many applications, it is necessary for a light source to be eye-proof for the human eye. In the case of semiconductor lasers, additional measures are to be taken for this purpose; in particular, the laser radiation can be expanded and distributed by means of diffractive optical elements. If such a diffractive optical element is formed from a material having a relatively low refractive index, thus, the eye protection can be restricted depending on the environmental conditions.

For example, in the case of dew or condensation water formation or moisture precipitation on the diffractive optical element, due to the then reduced refractive index difference between the surroundings and the optically effective structure, the beam-expanding effect of the diffractive optical element can be lost. In the case of the semiconductor laser described here, this problem is eliminated, since even in the case of dew formation on the diffractive optical element, there is a sufficiently large refractive index difference, in order to ensure eye safety by means of the beam shaping resulting from the diffractive optical element.

Furthermore, it is possible to fasten the diffractive optical element described here to the semiconductor laser chip with a connecting means. In this case, as an adhesive, for example, organic plastics or else inorganic materials having a comparatively low refractive index such as $SiO_2$ can be used. Such materials can penetrate into the optically effective structure and can also fill, for example, the grid-like optically effective structure, since the diffractive optical element still functions as before on account of the significant refractive index difference still present.

By using appropriate materials, it is also possible for the diffractive optical element to be applied with a suitable joining process either on wafer-level to the not yet been singulated semiconductor laser chips or to the already singulated semiconductor laser chips, jointly or in groups. Such methods are efficiently made possible by the optically effective structure having the high refractive index.

According to at least one embodiment, the semiconductor laser can be surface-mounted. This means that the semiconductor laser is preferably useable in lead-free soldering processes or also adhesive processes for surface mount technology or SMT for short. The semiconductor laser can be mechanically and/or electrically mounted, in particular, without penetration, on a mounting support such as a circuit board.

According to at least one embodiment, the diffractive optical element is located on the light exit surface. Between the diffractive optical element and the light exit surface, there is preferably only a connecting means, via which the diffractive optical element is connected to the semiconductor laser chip. In particular, the connecting means is located over the whole area between the light exit surface and the diffractive optical element. It is thus possible for the entire light exit surface to be covered by the connecting means and the diffractive optical element. In this case, the connecting means is preferably transmissive, in particular transparent to the generated laser radiation.

According to at least one embodiment, the optically effective structure of the diffractive optical element is located on a side of the diffractive optical element facing the semiconductor laser. In particular, the optically effective structure is in direct contact with the connecting means in places or over the whole area and/or the optically effective structure is partially or completely filled and/or planarized by the connecting means.

According to at least one embodiment, between the semiconductor laser chip and the diffractive optical element the connecting means is located only at an edge of the diffractive optical element. In particular, the light exit surface is free or predominantly free of the connecting means. A gap can be formed between the light exit surface and the diffractive optical element in places or over the whole area on the light exit surface. In this context, 'gap' means, for example, that no solid material and no liquid are present. The gap can be filled with one or more gases or can be evacuated. In this case, the connecting means can also be impermeable to the generated laser radiation and is, for example, of a metal or a metal alloy.

According to at least one embodiment, the diffractive optical element is located directly on the light exit surface. This preferably applies for the whole area of the entire light exit surface. The optically active structure can be located on a side of the diffractive optical element facing the light exit surface or on a side of the diffractive optical element facing away from the light exit surface.

According to at least one embodiment, the diffractive optical element has a carrier substrate. The carrier substrate is, for example, a semiconductor substrate, for instance of gallium nitride or gallium arsenide, or is a transparent material such as sapphire or silicon carbide. The carrier substrate is preferably permeable to the laser radiation generated during operation.

According to at least one embodiment, the optically effective structure is formed in the carrier substrate. By way of example, the carrier substrate can be structured in a photolithographic manner.

According to at least one embodiment, the optically effective structure is formed from a raw material layer which is applied to the carrier substrate. In other words, in this case the carrier substrate itself is not, but the raw material layer is structured, for example, by photolithography or by means of a nanoimprint method.

According to at least one embodiment, the optically active structure penetrates the diffractive optical element only in part. In particular, the carrier substrate and/or the raw material layer are obtained as a continuous, uninterrupted layer. In other words, the optically effective structure then extends only incompletely through the carrier substrate and/or the raw material layer. Alternatively, it is possible for the diffractive optical element to be penetrated entirely by the optically effective structure so that the optically effective structure forms continuous holes or openings in the diffractive optical element.

According to at least one embodiment, the optically active structure has one or more semiconductor materials or consists of one or more semiconductor materials. It is possible for the optically effective structure to consist of the same or to be produced from other semiconductor materials as the semiconductor layer sequence of the semiconductor laser chip. If the optically active structure comprises or consists of at least one semiconductor material, thus, the carrier substrate of the diffractive optical element preferably represents a growth substrate for this semiconductor material of the optically effective structure.

According to at least one embodiment, the semiconductor laser chip comprises a growth substrate for the semiconductor layer sequence. The semiconductor layer sequence is preferably grown epitaxially on the growth substrate and the growth substrate is preferably still present in the finished semiconductor laser.

According to at least one embodiment, the diffractive optical element is formed in the growth substrate of the semiconductor laser chip. In this case, the diffractive optical element, in particular its optically active structure, is preferably located on a side of the growth substrate which faces away from the semiconductor layer sequence having the active zone.

According to at least one embodiment, the diffractive optical element forms the light exit surface of the semiconductor laser chip. In other words, the generated laser radiation leaves the semiconductor laser chip on the diffractive optical element, in particular on the optically active structure.

According to at least one embodiment, the diffractive optical element and the semiconductor laser chip are formed in one single piece. This means, for example, that there is no joining zone or bonding agent layer between the semiconductor laser chip and the diffractive optical element. In particular, the semiconductor laser chip and the diffractive optical element have a common component, which is formed specifically by the growth substrate of the semiconductor layer sequence.

According to at least one embodiment, the semiconductor laser chip and a connecting means for the diffractive optical element are mounted on a common mounting support. In a plan view of the light exit surface, the connecting means is preferably located exclusively alongside the semiconductor layer sequence and/or alongside the semiconductor laser chip and/or next to the active zone. In particular, the connecting means and the semiconductor laser chip do not touch each other.

According to at least one embodiment, the connecting means is in direct contact with the mounting support and/or the diffractive optical element. In this case, the connecting means can engage in the optically effective structure of the diffractive optical element and can partially fill this structure.

According to at least one embodiment, the diffractive optical element completely covers the light exit surface and/or the semiconductor layer sequence and/or the semiconductor laser chip. This applies, in particular, in a plan view.

According to at least one embodiment, the semiconductor laser has a plurality of semiconductor laser chips. The semiconductor laser chips can be structurally identical to one another and can emit radiation of the same wavelength, or can be designed differently from one another.

According to at least one embodiment, the semiconductor laser chip or at least one of the semiconductor laser chips has a plurality of laser regions. In this case, the semiconductor laser preferably comprises exactly one semiconductor laser chip. In particular in the case of lasers of the type of VCSELs (vertical cavity surface emitting lasers), the semiconductor laser chip contains a plurality of laser regions, also referred to as individual lasers, which are preferably oriented parallel to one another and/or which comprise resonator axes oriented in parallel with the growth direction of the semiconductor layer sequence. The individual lasers can form individual VCSELs so that the relevant semiconductor laser chip represents a VCSEL array. A sufficient or particularly high optical output power can be achieved by means of such a VCSEL array. The individual lasers are preferably arranged in the form of a matrix in the semiconductor laser chip and can preferably be operated in parallel. The individual lasers can be electrically connected in parallel to one another and/or can be operated only jointly. The individual lasers can likewise be controllable individually or in groups independently of one another.

It is possible for a diffractive optical element to cover a plurality of semiconductor laser chips and/or to jointly cover a plurality of individual lasers and to combine them to form one component.

According to at least one embodiment, the semiconductor laser chips of the semiconductor laser are jointly and preferably completely covered by the diffractive optical element. In particular, all light exit surfaces of the semiconductor laser chips can in each case be completely covered by the diffractive optical element. In this case, the diffractive optical element preferably extends continuously, in one piece and/or without gaps over all the semiconductor laser chips.

According to at least one embodiment, the diffractive optical element is located close to the semiconductor laser chip and/or at the light exit surface. Preferably, a distance between the diffractive optical element and the semiconductor laser chip is at most 20 times or to times or 5 times and/or at least 1 times or 2 times or 4 times the wavelength of maximum intensity of the laser radiation. Alternatively or additionally, the distance between the semiconductor laser chip and the diffractive optical element is at most 0.5 mm or 0.2 mm or 0.05 mm or 20 µm. This means that there is no or no significant spatial separation between the diffractive optical element and the semiconductor laser chip.

According to at least one embodiment, the diffractive optical element and/or the at least one semiconductor laser chip are surrounded in places or over the whole area directly by a casting material. The casting material is preferably formed from a plastic having a comparatively low refractive index, for example, a silicone or an epoxide or an acrylate or a polycarbonate. The casting material is preferably transparent to the generated laser radiation.

According to at least one embodiment, the casting material touches the optically effective structure. The casting material can touch the optically effective structure only at an edge or can else extend over the entire light exit surface.

According to at least one embodiment, the semiconductor layer sequence comprises one or more Bragg mirrors. The at least one Bragg mirror is designed to reflect the laser radiation.

According to at least one embodiment, the Bragg mirror is penetrated by at least one electrical through-connection. The through-connection is preferably metallic. In particular, the through-connection is electrically insulated from the Bragg mirror through which it runs.

According to at least one embodiment, electrical connection surfaces are provided for the external electrical contact of the semiconductor laser on a common side of the active zone. The semiconductor laser can thus be surface-mountable.

According to at least one embodiment, at least one current constriction is formed in the at least one Bragg mirror or in several of the Bragg mirrors. As a result, the active zone is energized during operation only in one or in a plurality of current conduction regions of the current constriction. The current constriction preferably lies within the associated Bragg mirror and not at an edge of the Bragg mirror, along the growth direction of the semiconductor layer sequence.

According to at least one embodiment, the semiconductor laser comprises two of the Bragg mirrors. These lie on different sides of the active zone. In this case, it is possible for each of the Bragg mirrors to be penetrated by the through-connection or by one or more of the through-connections.

According to at least one embodiment, the semiconductor laser comprises an anode contact and/or a cathode contact. The contacts are preferably metallic contacts. A current impression preferably takes place directly into the semiconductor layer sequence via the contacts.

According to at least one embodiment, the anode contact and/or the cathode contact extend/extends between the semiconductor layer sequence and the diffractive optical element. The light exit surface can thus be surrounded all around by a material of the anode contact and/or of the cathode contact on a side facing the diffractive optical element, viewed in a plan view. In this case, the anode contact and/or the cathode contact for the generated laser radiation is/are impermeable and/or metallic.

Further, a method for producing a semiconductor laser is provided. The method preferably produces a semiconductor laser as specified in connection with one or more of the above-mentioned embodiments. Features of the method are therefore also disclosed for the semiconductor laser and vice versa.

In at least one embodiment, the method comprises the following steps, preferably in the specified order: providing the semiconductor laser chip, and attaching the diffractive optical element to the semiconductor laser chip and/or shaping the diffractive optical element in the semiconductor laser chip.

In the method described here and the semiconductor laser described here, a cost-intensive and/or material-intensive active adjustment on the component level can be omitted. Because of the use of semiconductor processes, in particular by means of passive adjustment at the wafer level, additionally a cost reduction can be carried out during the production. For example, it is possible to provide a production of a component of the semiconductor laser already at the wafer level for specific customer-specific emission characteristics, in order, for example, to enable a collimated radiation for simpler further processing on the customer side.

Furthermore, layers or materials having a high refractive index can usually be efficiently structured using the processes available in semiconductor fabrication. In particular, diffractive optical elements can already be combined with the semiconductor laser chips at the wafer level. This makes it possible to precisely adjust diffractive optical elements and semiconductor laser chips with respect to one another if this is required. In this case, a mounting effort is significantly reduced. In addition, the semiconductor lasers can already be tested at the wafer level and the effect of the diffractive optical elements can be analyzed and checked even at the wafer level.

In the diffractive optical element described here, which is intimately connected to the semiconductor laser chip, there is no need for a subsequent covering of the semiconductor laser chips with a separate diffractive optical element. In addition, the diffractive optical element can serve as a protective layer for the semiconductor laser chip in the semiconductor laser described here. If the diffractive optical element is adhesively bonded to the semiconductor laser chip, for example, thus, the carrier substrate of the diffractive optical element can already ensure sufficient mechanical protection for the semiconductor laser. Due to the high refractive index of the optically effective structure, it is also possible that the optically active structure is located on a side of the diffractive optical element facing away from the semiconductor laser chip, and that the diffractive optical element is coated with a housing plastic in order to achieve additional protection.

BRIEF DESCRIPTION OF THE DRAWINGS

A semiconductor laser described here and a method described here are explained in more detail below with reference to the drawing on the basis of exemplary embodiments. Identical reference signs indicate the same elements in the individual figures. However, no relationships to scale are shown, and individual elements can be represented with an exaggerated size in order to afford a better understanding.

In the Figures:

FIGS. 1A to 1F, 2A to 2D, 3A to 3B, 4A to 4H, 15A to 15E and 16A to 16E show schematic sectional representations of method steps of exemplary embodiments of methods;

FIGS. 5 to 9, 10A to 10B, 11A to 11B, 12A to 12B, 13A to 13B, 14B and 17 show schematic sectional representations of exemplary embodiments of semiconductor lasers.

DETAILED DESCRIPTION OF ILLUSTRATIVE EMBODIMENTS

Figure 1A:
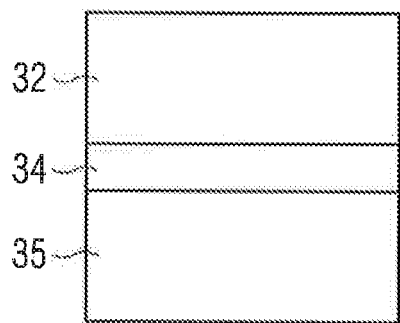

FIG. 1 illustrates an exemplary embodiment of a production method for a surface-mountable semiconductor laser 1 described here. According to FIG. 1A, a carrier substrate 32 for a diffractive optical element 3 is provided. The carrier substrate 32 is, for example, a sapphire substrate.

A separating layer 34 is produced, for example, by epitaxial growth on the carrier substrate 32. The separating layer 34 is, for example, a GaN layer. Furthermore, a raw material layer 35 is deposited on the separating layer 34, for example, epitaxially or by means of sputtering. The raw material layer 35 is made of aluminum nitride, for example.

Figure 1B:
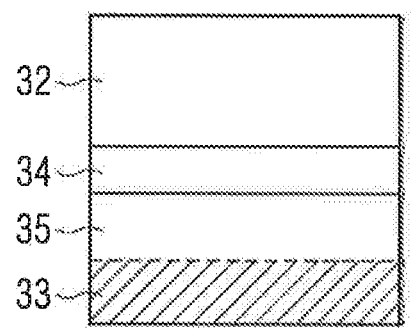

In the method step of FIG. 1B, an optically effective structure 33 is formed in the raw material layer 35. The optically effective structure 33 is produced for instance by lithography and etching. For example, the optically effective structure 33, which is symbolized by hatching in FIG. 1, has a grid-like shape when viewed in a plan view. Structural sizes of the optically effective structure 33, viewed in plan view, lie, for example, in the region of a quarter or a half wavelength of the laser radiation L generated during operation of the finished semiconductor laser L. The same can apply to a thickness of the optically effective structure 33, wherein the thickness is alternatively or additionally smaller than or equal to 2 µm or 1 µm. The optically effective structure 33 penetrates the raw material layer 35 only partially. Here and below, the optically effective structure 33 is only illustrated in a very simple manner.

In a plan view, the optically effective structure 33 preferably has structural elements having an average size of at least 0.5 µm to 1 µm. A height of the structure elements depends on the planned refractive index difference between the optically effective structure 33 and an environment and is to be sufficiently large, in order to bring about the required optical path difference by means of a phase shift.

Figure 1C:
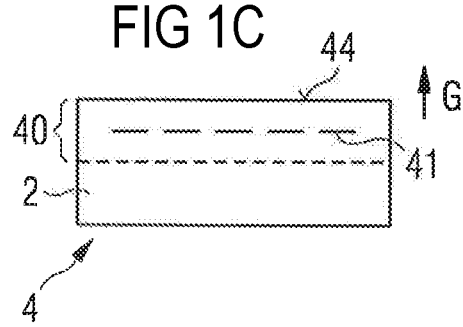

In the method step of FIG. 1C, a semiconductor laser chip 4 is provided. The semiconductor laser chip 4 is a surface-emitting laser. The semiconductor laser chip 4 has a growth substrate 2 for a semiconductor layer sequence 40. The semiconductor layer sequence 40 has a growth direction G in the direction away from the growth substrate 2. Furthermore, the semiconductor layer sequence 40 comprises at least one active zone 41 for generating the laser radiation L. A light exit surface 44 of the semiconductor laser 4 is formed by the semiconductor layer sequence 40 and is oriented perpendicular to the growth direction G.

The growth substrate 2 is, for example, a GaAs substrate. The semiconductor layer sequence 40 is based in particular on the material system AlInGaAs. Deviating from the illustration in FIG. 1, it is possible for a replacement substrate to be used instead of the growth substrate 2, the semiconductor layer sequence 40 is applied on the replacement substrate after growth. In this case, the growth substrate 2 is removed.

Figure 1D:
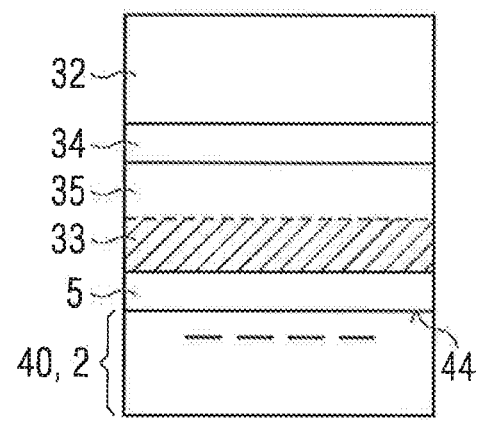

In the method step of FIG. 1D, the component from FIG. 1B is applied to the semiconductor laser chip 4 from FIG. 1C. This takes place via a layer of a connecting means 5. The connecting means 5 which is transmissive to the laser radiation L extends over the whole area and continuously between the semiconductor laser chip 4 and the component from FIG. 1B. The connecting means 5 is, for example, an organic adhesive. It is possible for the connecting means 5 to fill the optically effective structure 33 made of the high-refractive material. On account of the high refractive index of the optically effective structure 33, a sufficiently large refractive index difference to the connecting means 5 is maintained, so that the optically effective structure 33 achieves the desired effect.

Figure 1E:
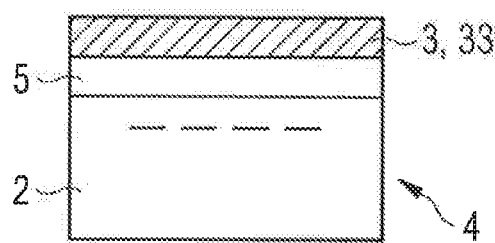

According to FIG. 1E, only the optically effective structure 33 remains on the semiconductor laser 4. This is affected in particular via a laser lifting process through the carrier substrate 32. In particular, a laser radiation is irradiated through the carrier substrate 32, said laser radiation decomposes the separating layer 34 so that the carrier substrate 32 can be lifted off. Alternatively or in addition to a laser lifting method, etching and/or grinding and/or polishing can also be carried out. Optionally, any residues of the separating layer 34 are removed from the optically effective structure 33. The surplus raw material layer 35 is optionally also completely removed.

The separating layer 34 ultimately serves to remove the carrier substrate 32 by means of a lifting method such as a laser lifting method. For this purpose, the separating layer 34 can be a semiconductor layer as explained, but this is not absolutely necessary. In order to remove it, it is only necessary for the separating layer 34 to be partially or completely decomposable with a method such as laser decomposition or etching. For the separating layer 34, a dielectric and/or an organic material such as polymerized bisbenzocyclobutene, BCB for short, can be used.

Figure 1F:
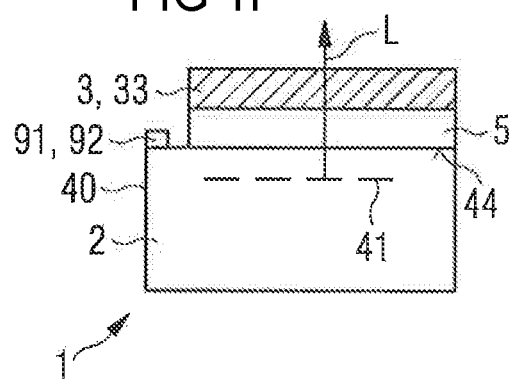

In the method step of FIG. 1F, it is shown that the semiconductor layer sequence 40 is exposed in places, wherein the connecting means 5 and the optically effective structure 33, which forms the diffractive optical element 3, are removed in places. Electrical contacts 91, 92 can be arranged in the exposed region of the semiconductor layer sequence 40 in order to energize the active zone 41, illustrated only in a highly simplified manner in FIG. 1F.

As an alternative to the representation in FIG. 1, the diffractive optical element 3 can have the recess for the electrical contacts 91, 92 shown in FIG. 1F right before the method step of FIG. 1D, for example, in the step of FIG. 1B. The same applies to all other exemplary embodiments.

Figure 2A:
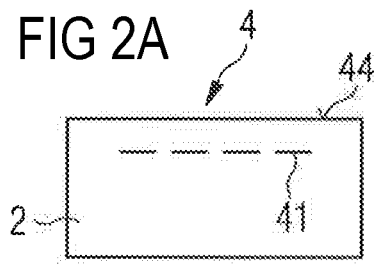
Figure 2B:
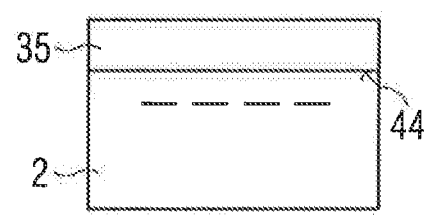

In the method of FIG. 2, firstly a semiconductor laser chip 4 is provided, see FIG. 2A. Subsequently, the raw material layer 35 is deposited on the light exit surface 44, see FIG. 2B. The raw material layer 35 is composed, for example, of deposited amorphous aluminum oxide.

Figure 2C:
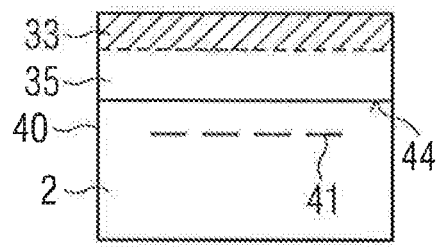

Thereupon, see FIG. 2C, the optically effective structure 33 is produced in the raw material layer 35. The optically effective structure 33 does not extend to the light exit surface 44. Alternatively, differently than shown in FIG. 2C, the optically effective structure 33 can also extend to the semiconductor layer sequence 40.

Figure 2D:
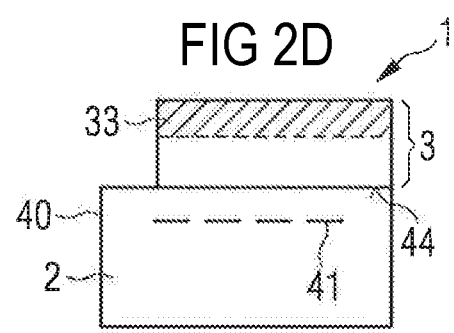

FIG. 2D shows that the semiconductor layer sequence 40 is exposed in places, in order to make electrical contacting possible, analogously to FIG. 1F.

Figure 3A:
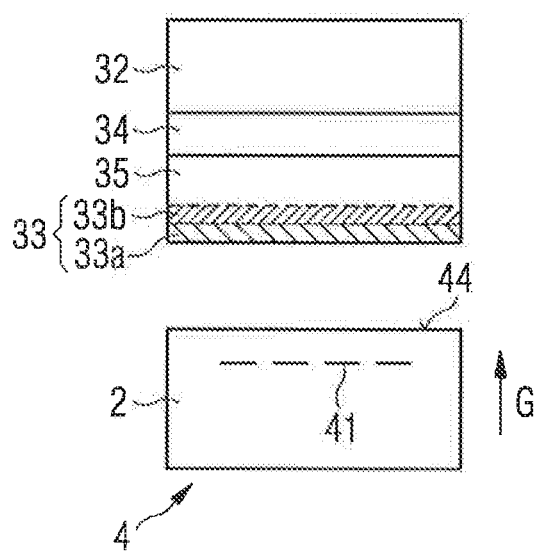

In FIG. 3A, the semiconductor laser chip 4 is provided in a further exemplary production method. Furthermore, the optically effective structure 33 is provided on the carrier substrate 32. The optically effective structure 33 can consist of two partial structures 33a, 33b, which are symbolized in FIG. 3 by different hatching. Such an optically effective structure 33 with a plurality of partial structures can also be used in all other exemplary embodiments. It is possible for more than two partial structures to be present.

Figure 3B:
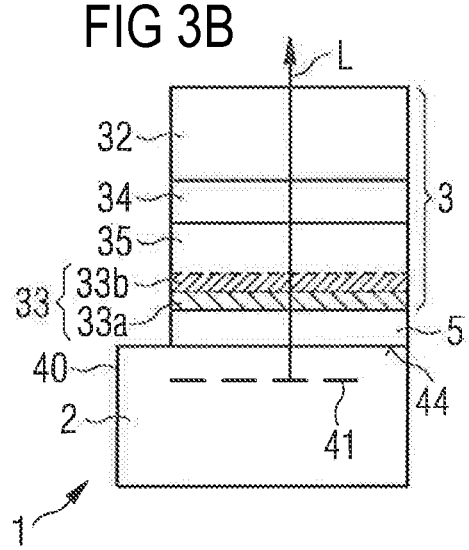

FIG. 3B shows that the two components from FIG. 3A are connected to each other by means of the connecting means 5 and that a part of the semiconductor layer sequence 40 is exposed for making electrical contact.

Unlike in FIGS. 1 and 2, the diffractive optical element 3 in the finished semiconductor laser 1 of FIG. 3 still has the remaining raw material layer 35, the separating layer 34, which is optional, and the carrier substrate 32. The laser radiation L is transmitted through the layer comprising the connecting means 5, the optically effective structure 33, the raw material layer 35, the optional semiconductor layer 34 as well as through the carrier substrate 32. The carrier substrate 32 is preferably of sapphire or of silicon carbide. In all other exemplary embodiments, it is in principle possible, too, that the carrier substrate 32 is still present in the finished semiconductor laser 1.

In the method of FIG. 4, the raw material layer 35 is produced directly on the carrier substrate 32. The carrier substrate 32 is, for example, GaAs, and the raw material layer 35 is made of AlP, for example.

Figure 4A:
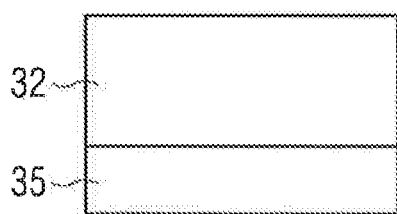
Figure 4B:
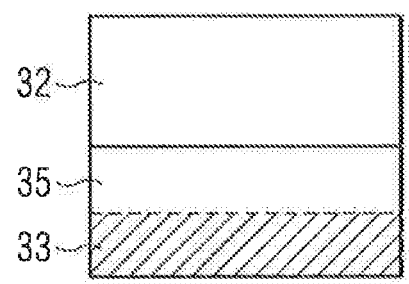

According to FIG. 4B, the optically effective structure 33 is produced in the raw material layer 35.

Figure 4C:
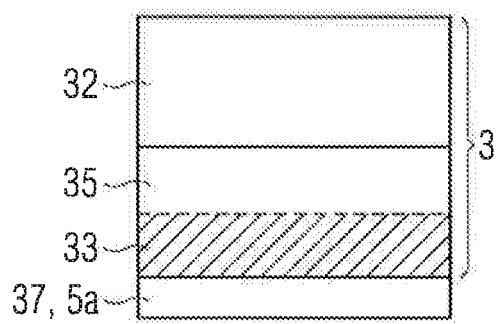

FIG. 4C shows that a planarization layer 37 is applied in order to planarize the optically effective structure 33. The planarization layer 37, 5a is required for subsequent connection to the semiconductor laser chip 4 provided in FIG. 4D. The two layers 5a, 5b on the diffractive optical element 3 and on the semiconductor laser chips 4 are made of $SiO_2$, for example, and are, for example, electrochemically polished, before a sparking is preferably carried out, see FIG. 4E. In this way, the layers 5a, 5b together form the bonding agent layer 5.

Figure 4D:
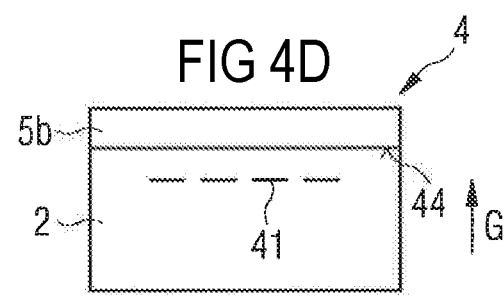
Figure 4E:
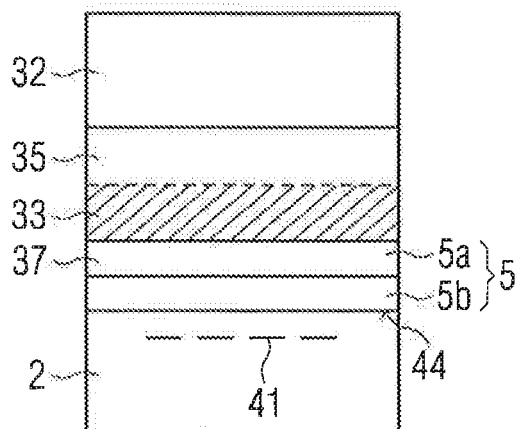
Figure 4F:
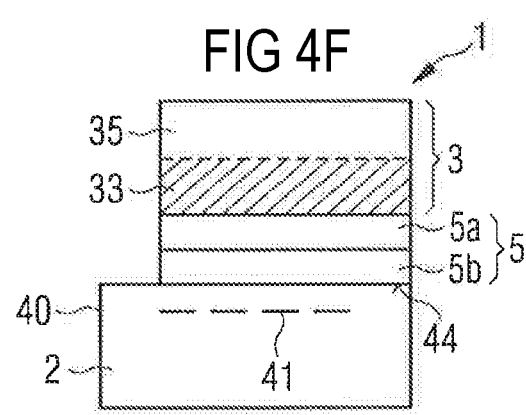

Optionally, see FIG. 4F, the carrier substrate 32 is removed. As in FIG. 1F, the semiconductor layer sequence 40 is exposed in places for making electrical contact.

According to FIG. 4, in particular an AlP layer is thus structured directly on the GaAs substrate, is subsequently planarized and connected to the semiconductor laser chip 4 via a process such as direct bonding. As in all other exemplary embodiments, for example, flowable oxides, FOX for short, can be used as the material for the connecting means 5. Organic materials such as crosslinked dibenzocyclobuthen layers can also be used.

In FIGS. 1 to 4, the application of only one diffractive optical element 3 to only one semiconductor laser chip 4 is illustrated. Deviating therefrom, a wafer-to-wafer process can also be used in FIGS. 1 to 4, in order to apply a plurality of diffractive optical elements to a plurality of semiconductor laser chips at the same time. The respective methods of FIGS. 1 to 4 can thus be carried out both in a wafer-to-wafer process and in a chip-to-wafer process or in a chip-to-chip process. However, a wafer-to-wafer process is preferred for efficiency reasons.

Furthermore, unlike in FIG. 4 and in a manner analogous to FIG. 1, it is possible for an adhesive to be used instead of direct bonding, in order to connect the two components from FIGS. 4C and 4D to one another. In this case, the layer with the connecting means 5 is preferably realized by a single layer. Adhesive bonding or sparking or direct bonding can also be used in all other exemplary embodiments as alternative methods for connecting the two components to one another.

Figure 4G:
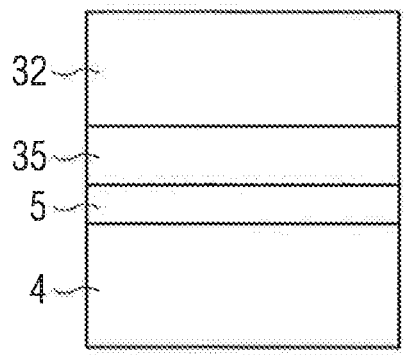
Figure 4H:
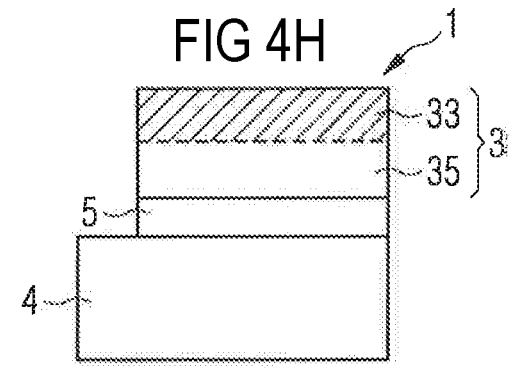

As a further alternative to the method of FIG. 4, it is possible that the raw material layer 35 is first attached to the carrier substrate 32 on the semiconductor laser chip 4, see FIG. 4G, and that just after the detachment of the carrier substrate 32 the optically effective structure 33 is produced, see FIG. 4H. Since the optically effective structure 33 is produced only on the semiconductor chip 4, only a comparatively coarse pre-adjustment of the component from FIG. 4G relative to the semiconductor laser 4 is necessary.

Figure 5:
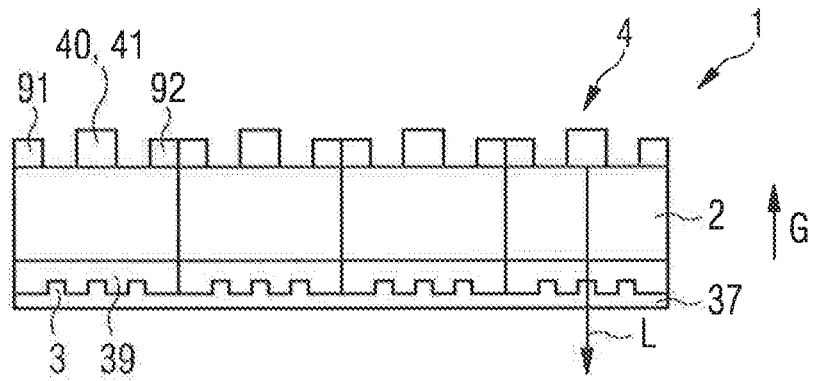

In the exemplary embodiment of FIG. 5, it is shown that a plurality of the semiconductor laser chips 4 are present. The diffractive optical element 3 extends in one piece and together over the semiconductor laser chips 4. For example, the diffractive optical element 3 and the semiconductor laser chips 4 are still contacted with one another in the wafer composite by means of wafer bonding, so that a joining region is formed. In this case, the diffractive optical element 3 is located on a side of the growth substrate 2 which faces away from the semiconductor layer sequence 40. The electrical contacts 91, 92 are located laterally alongside the semiconductor layer sequence 40 comprising the active zone 41. Optionally, a singulation to separate semiconductor lasers 1 with one or more semiconductor laser chips 4 in each case can be carried out, not shown.

Optionally, the planarization layer 37 is present on a side of the diffractive optical element 3 facing away from the semiconductor layer sequence 40, as is possible in all other exemplary embodiments, too, in which the optically effective structure 33 is located on an outer side.

Figure 6:
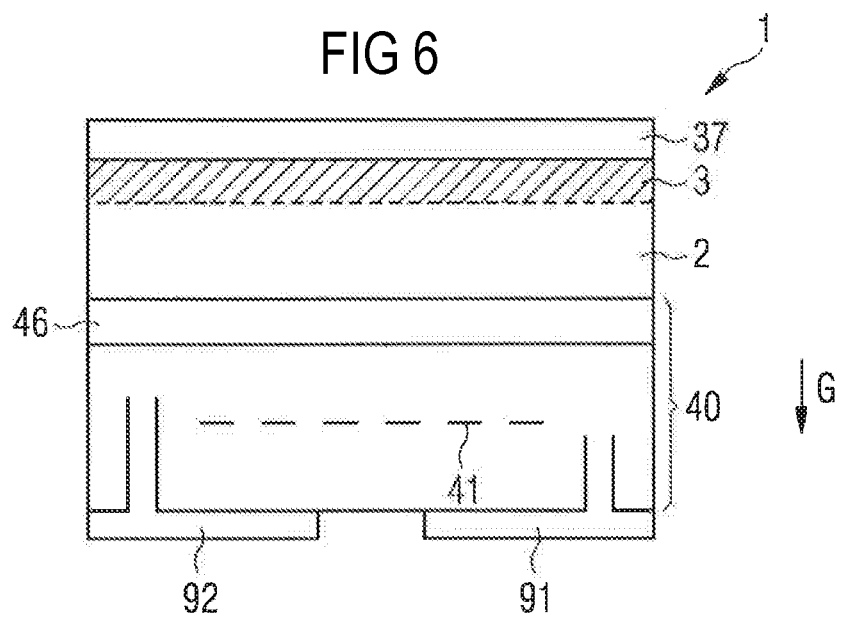
Figure 7:
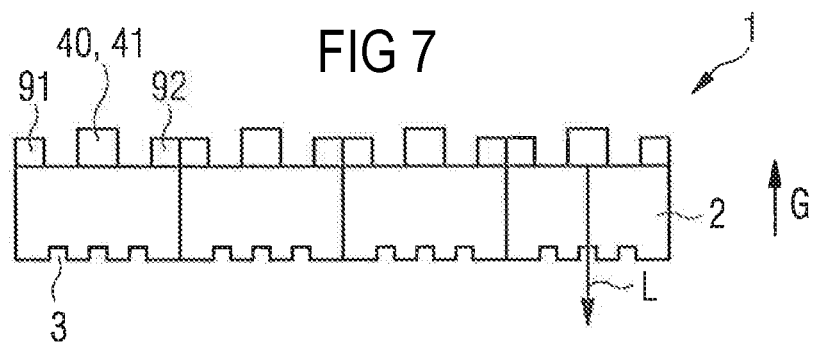

FIGS. 6 and 7 illustrate that the optically effective structure 33 is formed directly in the growth substrate 2. According to FIG. 6, the electrical contacts 91, 92 are designed in such a way that they partly run within the semiconductor layer sequence 40, wherein one of the contacts 92 passes through the plane with the active zone 41. As in all other exemplary embodiments, it is possible that a Bragg mirror 46 is located between the region with the active zone 41 and the growth substrate 2. Optionally, the planarization layer 37 is again present.

The refractive index of silicon nitride is often taxed above 2. In plasma-enhanced chemical vapor deposition, SiN:H layers having a lower refractive index can be produced, for example, at 633 nm approximately 1.85. The optically effective structure 33 of FIG. 6 is in particular made of SiN:H or also of sapphire.

In FIG. 7, the growth substrate 2 and the diffractive optical element 3 are monolithically integrated, instead of using separate diffractive optical elements, as illustrated, for example, in conjunction with FIG. 1, 3, 4 or 5.

FIG. 8 illustrates that the electrical contacts 91, 92 are located on different sides of the growth substrate 2. A corresponding design can also be used in all other exemplary embodiments.

FIG. 9 shows that the diffractive optical element 3 is applied to the side with the semiconductor layer sequence 40. In this case, it is possible for the diffractive optical element 3 to laterally surround the respectively associated semiconductor layer sequence 40, that is, in the direction perpendicular to the growth direction G, or, in contrast to the drawing, to terminate flush with the semiconductor layer sequence 40. Furthermore, it is possible, as in all other exemplary embodiments, too, for one of the electrical contacts 92 to be applied in a planar manner.

In the exemplary embodiment of FIG. to, a casting material 7 is additionally present. In this case, the diffractive optical element 3 is primarily fastened by means of the connecting means 5 which is, for example, an adhesive or a flowable oxide. The casting material 7 extends in places to a side of the diffractive optical element 3 facing the semiconductor laser chip 4 and is in direct contact with the optically effective structure 33 in places.

In contrast, according to FIG. 10B, the diffractive optical element 3 is fastened by means of the casting material 7, which at the same time represents the connecting means 5. The semiconductor laser 1 can be protected against external influences by means of the casting material 7. Due to the high refractive index of the optically effective structure 33, it is harmless when the casting material 7 covers and/or fills the optically effective structure 33.

In FIGS. 10A and 10B, the optically effective structure 33 faces away from the semiconductor laser chip 4 or away from the semiconductor laser chip 4. Both arrangement possibilities of the optically effective structure 33 can be used in an analogous manner.

FIG. 11A shows that the connecting means 5 is applied on the light exit surface 44 in a frame-shaped manner, wherein a region directly above the active zone 41, which is configured to generate the laser radiation, is preferably free of the connecting means 5. For example, the connecting means 5 is a metal layer so that the diffractive optical element 3 is joined to the semiconductor laser chip 4, for example, by soldering, in particular eutectic, quasi-eutectic or isothermally solidifying. The connecting means 5 can be composed of a plurality of partial layers.

In FIG. 11A, the connecting means 5 engages in the optically effective structure 33 in places. In contrast, according to FIG. 1B, the optically effective structure 33 is limited to a region above the active zone 41. The connecting means 5 is thus spaced apart from the optically effective structure 33.

In FIG. 11A and also in FIG. 11B, a gap 6 is located between the diffractive optical element 3 and the semiconductor laser chip 4. The gap 6 is comparatively thin and is filled, for example, with air.

According to FIG. 11, a comparatively precise adjustment is carried out in order to ensure exact matching of the diffractive optical element 3 to the connecting means 5, which is designed in particular as a metal frame.

Figure 12A:
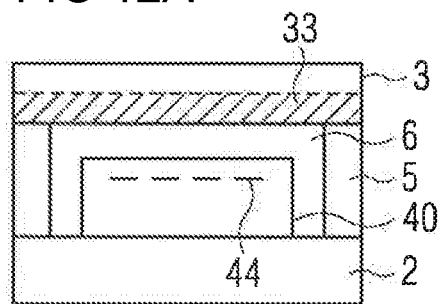

FIG. 12 shows that the connecting means 5 is spaced apart from the semiconductor layer sequence 40. The connecting means 5, for example, made of metal platforms, is in direct contact with the growth substrate 2 and with the diffractive optical element 3.

Figure 12B:
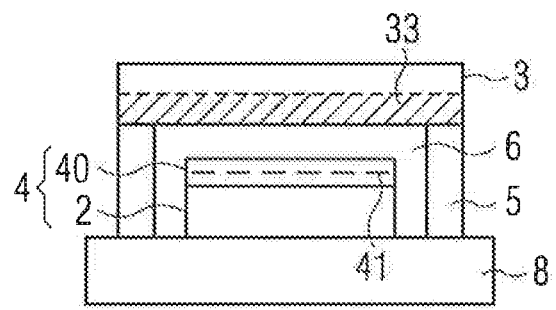

In contrast, see FIG. 12B, the connecting means 5 is mounted on a mounting support 8 and is not in direct contact with the semiconductor laser chip 4. The diffractive optical element 3 completely covers the semiconductor laser chip 4. Between the connecting means 5 and the semiconductor laser chip 4 on the one hand and between the semiconductor laser chip 4 and the diffractive optical element 3 on the other hand, a gap 6 is formed.

Figure 13A:
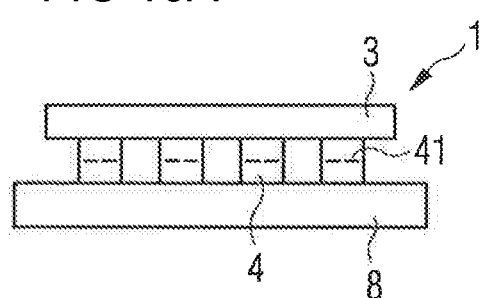

According to FIG. 13A, a plurality of the semiconductor laser chips 4 are mounted on the mounting support 8. The semiconductor laser chips 4 are jointly surrounded by the one-piece, continuous diffractive optical element 3. In this case, the diffractive optical element 3 can laterally project beyond the semiconductor laser chips 4.

Figure 13B:
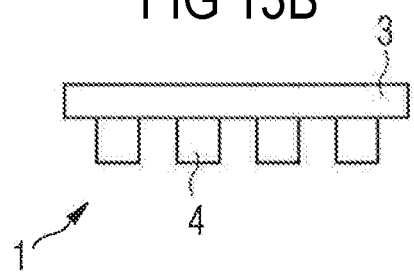

In contrast, according to FIG. 13B, the diffractive optical element 3 itself forms a carrier for the semiconductor laser chips 4. For this purpose, the diffractive optical element 3 can be provided with electrical contact structures, not shown.

Figure 14A:
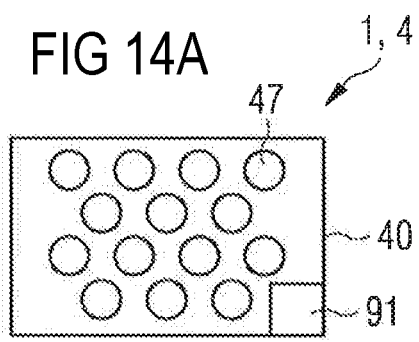
FIG. 14A shows a schematic plan view of an exemplary embodiment of a semiconductor laser.
Figure 14B:
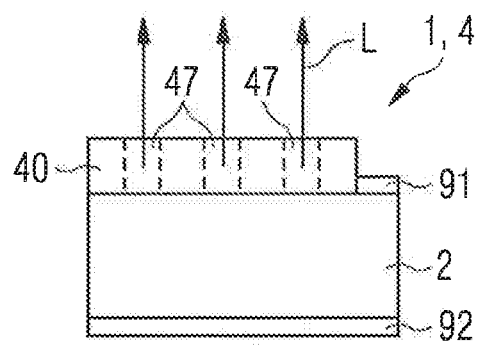

According to FIG. 13, the semiconductor laser 1 has a plurality of semiconductor laser chips 4, as can also be the case in all other exemplary embodiments. In the same way, it is in each case possible in the exemplary embodiments that only one or also a plurality of semiconductor laser chips 4 are present, which can have a plurality of laser regions or individual lasers 47, for example, an array of surface-emitting vertical resonator lasers, also referred to as a VCSEL array, see the top view in FIG. 14A and the sectional representation in FIG. 14B. The individual lasers 47 are arranged in a plan view, for example, in a hexagonal or rectangular or square pattern, and can be individually controllable, or all of them can be operated only jointly.

Figure 15E:
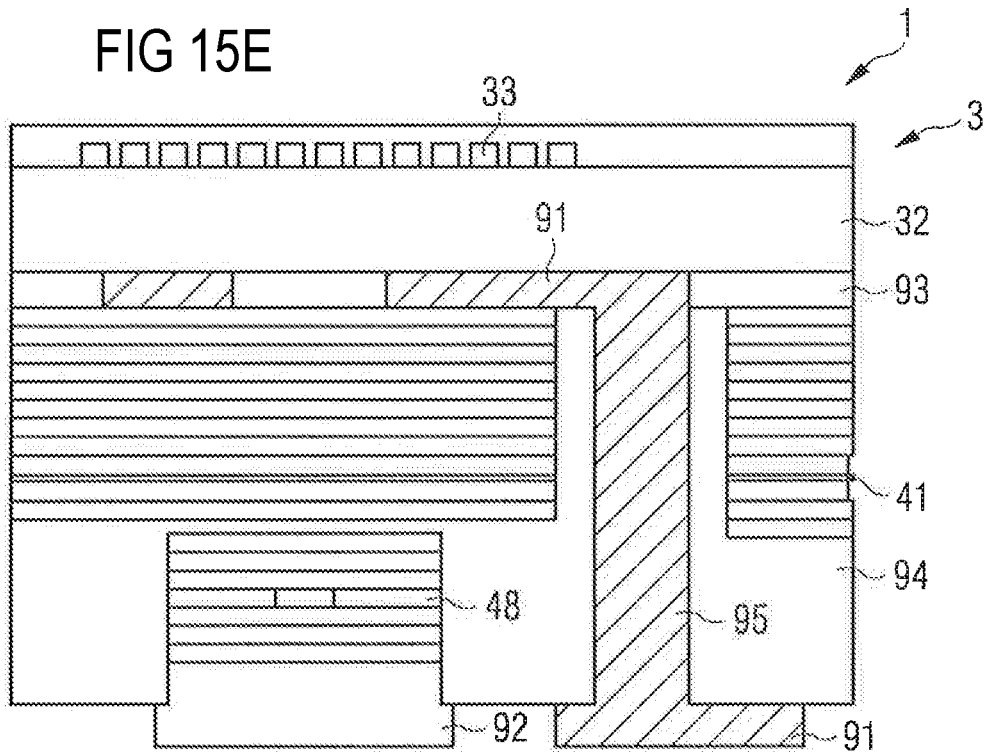

In the production method of FIG. 15, the semiconductor laser 1 is used as a flip-chip on a transparent carrier substrate 32, for instance made of glass, BF33 or sapphire. A planar diffractive optical element 3 is applied to the carrier substrate 32.

According to FIG. 15A, the semiconductor layer sequence 40 is grown epitaxially on the growth substrate 2, for example, made of GaAs. Coming from the growth substrate 2, the semiconductor layer sequence 40 comprises a first Bragg mirror 46a, the region with the active zone 41 and a second Bragg mirror 46b. Both Bragg mirrors 46a, 46b are preferably electrically conductive and comprise alternating layers having high and low refractive indices.

FIG. 15B shows that a bonding layer 93 and the anode contact 91 are produced on the second Bragg mirror 46b. The bonding layer 93 is made of $SiO_2$, for example, and the anode contact 91 is preferably composed of one or more metal layers. In the direction away from the second Bragg mirror 46a, the anode contact 91 and the bonding layer 93 preferably terminate flush with one another.

In the step of FIG. 5C, the transparent carrier substrate 32 is applied to the bonding layer 93 by means of wafer bonding. In this step, the optically effective structure 33 can already be located on the carrier substrate 32, or the optically effective structure 33 is attached to the carrier substrate 32 later.

The wafer bonding is, for example, direct bonding with $SiO_2$ to $SiO_2$. The optically effective structure 33 can be applied lithographically in particular after the growth substrate 2 has been removed and after the wafer bonding, as a result of which high accuracy can be achieved. The planarization layer 37 is preferably applied to the optically effective structure 33 so that the optically effective structure 33 is buried and is not exposed to the outside.

In FIG. 15D, the first Bragg mirror 46a is partially removed so that the region of the semiconductor layer sequence 40 with the active zone 41 is exposed. Preferably, a current constriction 48 is also produced, for instance by means of oxidation. Thus, the active zone 41 is supplied with current only in the region of the current constriction 48, since the semiconductor layer sequence 40 has only a low electrical conductivity in the region of the active zone 41 in the direction parallel to the active zone 41.

Finally, as shown in FIG. 5E, a filling material 94 is applied, into which the first Bragg mirror 46a is embedded. The filling material 94 is electrically insulating and, for example, a spin-on glass or an organic material such as benzocyclobutene, abbreviated BCB.

Subsequently, a preferably metallic through-connection 95 is produced through the filling material 94 and through the second Bragg mirror 46b. The region of the anode contact 91 at the bonding layer 93 is electrically connected to the through-connection 95. Likewise, the first Bragg mirror 46a is electrically contacted via a metallization. Said contact of the first Bragg mirror 46a is preferably reflective to the laser radiation generated during operation. The first Bragg mirror 46a together with this contact is thus a metal Bragg hybrid mirror. As a result, the first Bragg mirror 46a can have fewer layer pairs, for example, at most 12 layer pairs or at most 6 layer pairs.

Finally, electrical connection surfaces are produced for the two contacts 91, 92. The connection surfaces can cover the filling material 94 over a large area. The connection surfaces lie in a common plane so that the semiconductor laser 1 is an SMT component and can thus be surface-contacted.

Figure 16A:
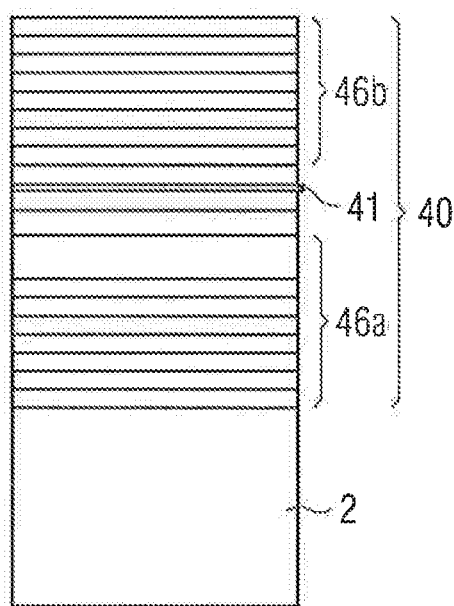

The method step of FIG. 16A is carried out analogously to the step of FIG. 15A.

Figure 16B:
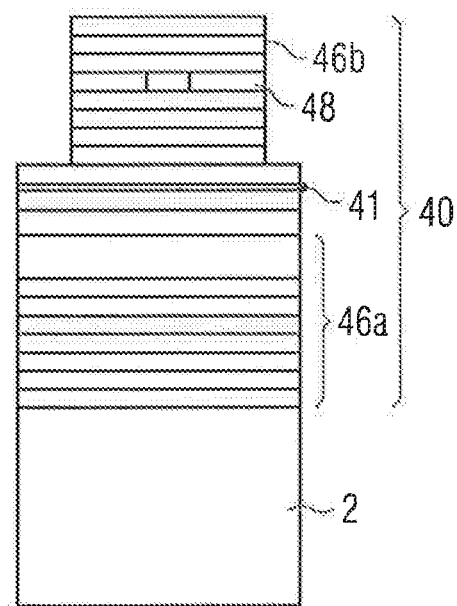

In contrast to FIG. 15B, however, in FIG. 16B the second Bragg mirror 46b is structured so that the region of the semiconductor layer sequence 40 with the active zone 41 is exposed from a side facing away from the growth substrate 2. In addition, the current constriction 48 is produced in the second Bragg mirror 46b.

The filling material 94 is then optionally applied in a planar manner. The anode contact 91 and the bonding layer 93 are subsequently produced and the diffractive optical element 3 is mounted, analogously to FIGS. 15B and 15C.

Then, the growth substrate 2 is removed, see FIG. 16D.

According to FIG. 16E, the through-connection 95 is guided through the first Bragg mirror 46a and through the filling material 94 to the anode contact 91 at the bonding layer 93. For this purpose, a further filling material 94 can be used for electrically insulating the through-connection 95 from the first Bragg mirror 46a.

Finally, the connection surfaces for the contacts 91, 92 are produced. This preferably takes place in the same manner as explained above in conjunction with FIG. 15E.

The methods of FIGS. 15 and 16 thus differ primarily in the position of the current constriction 48. Thus, either only the first or only the second Bragg mirror 46a, 46b is penetrated by the through-connection 95.

Figure 17:
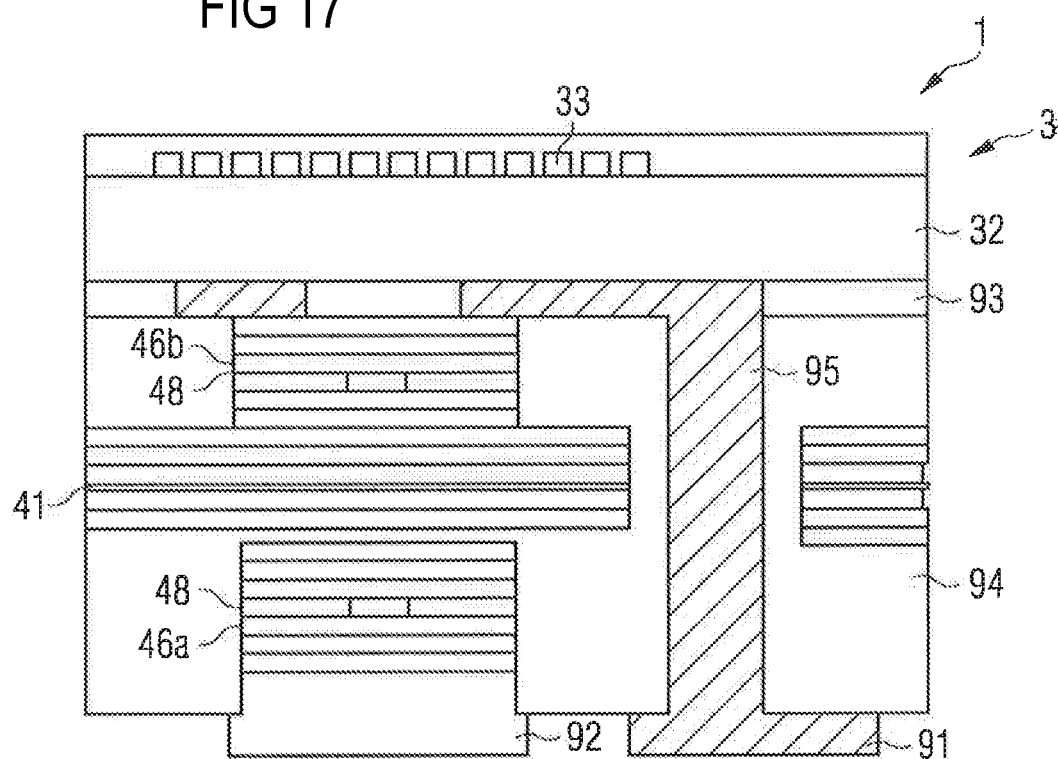

In contrast, in the exemplary embodiment of FIG. 17, the through-connection 95 is guided through both Bragg mirrors 46a, 46b. In this case, one of the current constrictions 48 is preferably present in each of the two Bragg mirrors 46a, 46b. To this end, the two Bragg mirrors 46a, 46b are structured. Except for the region with the through-connection 95, only the region of the semiconductor layer sequence 40 with the active zone 41 remains over the whole area. In other words, the exemplary embodiment of FIG. 17 represents a combination of the methods of FIGS. 15 and 16.

As in all other exemplary embodiments, the anode contact 91 and the cathode contact 92 can also be interchanged with one another with regard to the electrical polarity.

A higher integration density can be achieved with the diffractive optical element in the semiconductor lasers 1 described here. A cost reduction can also be achieved by means of a wafer-level integration of VCSEL 4 and optical system 3. Accurately fitting optics can be mounted, wherein inherently eye-proof components are achieved. Flip-chips with good thermal connection can be achieved. Overall, a high adjustment accuracy is thus achieved between the VCSEL chip 4 and the optical system 3 by means of the wafer level adjustment, with simultaneous cost reduction.

Furthermore, the composite of the VCSEL chip 4 and the optical system 3 is suitable for further processing, for example, with a potting and/or for embedding into other materials. This applies in particular to a planar integrated optically effective structure 33 within the carrier substrate 32.

The components shown in the figures follow, unless indicated otherwise, preferably in the specified sequence directly one on top of the other. Layers which are not in contact in the figures are spaced apart from one another. If lines are drawn parallel to one another, the corresponding surfaces are likewise oriented parallel to one another. The relative thickness ratios, length ratios and positions of the drawn components relative to one another are correctly reproduced in the figures if not indicated otherwise.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A semiconductor laser comprising:
   at least one surface-emitting semiconductor laser chip comprising:
      a semiconductor layer sequence having at least one active zone configured to generate laser radiation; and
      a light exit surface oriented perpendicular to a growth direction of the semiconductor layer sequence;
   a diffractive optical element configured to expand and distribute the laser radiation,
   wherein an optically active structure of the diffractive optical element is made of a material having a refractive index of at least 1.65 regarding a wavelength of maximum intensity of the laser radiation, and
   wherein the optically active structure of the diffractive optical element is located on a side of the diffractive optical element facing the semiconductor laser; and
   a connector engaging at least in places into the optically active structure and completely filling the optically active structure at least in places.

2. The semiconductor laser according to claim 1, wherein the diffractive optical element is located on the light exit surface so that between the diffractive optical element and the semiconductor laser chip, at least in places, only the connector for the diffractive optical element is located.

3. The semiconductor laser according to claim 2, wherein the connector extends over the whole area between the light exit surface and the diffractive optical element so that the connector completely covers the light exit surface.

4. The semiconductor laser according to claim 2, wherein the connector is arranged at an edge of the diffractive optical element so that the light exit surface is free of the connector and so that a gap is formed at least in places between the diffractive optical element and the light exit surface.

5. The semiconductor laser according to claim 1,
   wherein the diffractive optical element comprises a carrier substrate, and
   wherein the optically active structure is located on a side of the carrier substrate facing the light exit surface.

6. The semiconductor laser according to claim 5,
   wherein the optically active structure is composed of a semiconductor material, and
   wherein the carrier substrate is a growth substrate for the semiconductor material of the optically active structure.

7. The semiconductor laser according to claim 1, wherein the semiconductor laser chip comprises a growth substrate of the semiconductor layer sequence.

8. The semiconductor laser according to claim 1,
   wherein the semiconductor laser chip and the connector for the diffractive optical element are arranged on a common mounting support so that the connector, viewed in a plan view, extends exclusively next to the semiconductor laser chip and does not touch the semiconductor laser chip, and
   wherein the connector is in direct contact neither with the mounting support nor with the diffractive optical element, and the diffractive optical element completely covers the semiconductor laser chip.

9. The semiconductor laser according to claim 1, further comprising a plurality of semiconductor laser chips, wherein the semiconductor laser chips are jointly and completely covered by the diffractive optical element which is formed in a continuous and integral manner.

10. The semiconductor laser according to claim 1, wherein a distance between the diffractive optical element and the semiconductor laser chip is at most ten times the wavelength of maximum intensity of the laser radiation.

11. The semiconductor laser according to claim 1,
   wherein the diffractive optical element is surrounded at least in places directly by a casting material, and
   wherein the casting material touches the optically active structure.

12. The semiconductor laser according to claim 1, wherein the optically active structure of the diffractive optical element is made of a material having a refractive index of at least 2.0.

13. The semiconductor laser according to claim 1,
   wherein the semiconductor layer sequence comprises at least one Bragg mirror,
   wherein the Bragg mirror is penetrated by an electrical through-connection, and electrical connection surfaces are formed on a common side of the active zone so that the semiconductor laser is surface-mountable, and wherein the Bragg mirror is configured to produce a current constriction so that the active zone is supplied with current only in at least one current transmission region of the current constriction during operation.

14. The semiconductor laser according to claim 13, wherein the semiconductor laser comprises two Bragg mirrors which lie on different sides of the active zone, and wherein each Bragg mirror is penetrated by the through-connection.

15. The semiconductor laser according to claim 1,
wherein an anode contact or a cathode contact extends between the semiconductor layer sequence and the diffractive optical element so that the light exit surface, on a side facing the diffractive optical element and viewed in a plan view, is completely surrounded by a material of the anode contact or of the cathode contact, and
wherein the anode contact or the cathode contact is impermeable for the laser radiation and is metallic.

16. A method for producing the semiconductor laser according to claim 1, the method comprising:
providing the semiconductor laser chip; and
attaching the diffractive optical element to the semiconductor laser chip or forming the diffractive optical element in the semiconductor laser chip.

17. A semiconductor laser comprising:
at least one surface-emitting semiconductor laser chip comprising:
a semiconductor layer sequence having at least one active zone configured to generate laser radiation; and
a light exit surface oriented perpendicular to a growth direction of the semiconductor layer sequence;
a diffractive optical element configured to expand and distribute the laser radiation,
wherein an optically active structure of the diffractive optical element is made of a material having a refractive index of at least 1.65 regarding a wavelength of maximum intensity of the laser radiation,
wherein the optically active structure of the diffractive optical element is located on a side of the diffractive optical element facing the semiconductor laser; and
a connector arranged at an edge of the diffractive optical element so that the light exit surface is free of the connector and so that a gap is formed at least in places between the diffractive optical element and the light exit surface,
wherein the connector surrounds the optically active structure in a frame-like manner.

18. A semiconductor laser comprising:
at least one surface-emitting semiconductor laser chip comprising:
a semiconductor layer sequence having at least one active zone configured to generate laser radiation; and
a light exit surface oriented perpendicular to a growth direction of the semiconductor layer sequence; and
a diffractive optical element configured to expand and distribute the laser radiation,
wherein an optically active structure of the diffractive optical element is made of a material having a refractive index of at least 1.65 regarding a wavelength of maximum intensity of the laser radiation, and
wherein the semiconductor laser is eye-safe due to widening and distributing the laser radiation by the diffractive optical element.

* * * * *